(12) United States Patent
Fukuda et al.

(10) Patent No.: US 8,811,079 B2
(45) Date of Patent: Aug. 19, 2014

(54) SEMICONDUCTOR MEMORY DEVICE

(71) Applicant: Kabushiki Kaisha Toshiba, Tokyo (JP)

(72) Inventors: Ryo Fukuda, Yokohama (JP); Daisaburo Takashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 3 days.

(21) Appl. No.: 13/752,726

(22) Filed: Jan. 29, 2013

(65) Prior Publication Data

US 2013/0194867 A1    Aug. 1, 2013

(30) Foreign Application Priority Data

Feb. 1, 2012    (JP) .................................. 2012-019726

(51) Int. Cl.
G11C 14/00    (2006.01)

(52) U.S. Cl.
CPC ...................................... G11C 14/00 (2013.01)
USPC ............ 365/185.08; 365/185.17; 365/185.13; 365/185.21; 365/230.03; 365/185.11

(58) Field of Classification Search
CPC ........... G11C 16/0483; G11C 2213/79; G11C 13/0028; G11C 7/18; G11C 11/16; G11C 11/5621; G11C 16/0408; G11C 16/0433
USPC ............. 365/185.17, 185.11, 185.21, 185.13, 365/230.03, 185.08
See application file for complete search history.

(56) References Cited

U.S. PATENT DOCUMENTS

| | | |
|---|---|---|
| 5,641,979 A | 6/1997 | Ema et al. |
| 5,929,477 A | 7/1999 | McAllister Burns, Jr. et al. |
| 7,158,410 B2 | 1/2007 | Bhattacharyya et al. |
| 2006/0044870 A1 | 3/2006 | Bhattacharyya et al. |
| 2008/0048239 A1 | 2/2008 | Huo et al. |
| 2008/0195803 A1* | 8/2008 | Park et al. ..................... 711/103 |

FOREIGN PATENT DOCUMENTS

| | | |
|---|---|---|
| JP | 3-256292 | 11/1991 |
| JP | 10-209404 | 8/1998 |
| JP | 2001-167590 | 6/2001 |
| JP | 2003-007873 | 1/2003 |
| JP | 2008-511947 | 4/2008 |
| JP | 2011-171735 | 9/2011 |

OTHER PUBLICATIONS

Takashi Maeda et al. "Multi-stacked 1G cell/layer Pipe-shaped BiCS Flash Memory", 2009 Symposium on VLSI Circuits Digest of Technical Papers pp. 22-23.
Daisaburo Takashima et al. "An Embedded DRAM Technology for High-Performance NAND Flash Memories", 2011 IEEE International Solid-State Circuits Conference pp. 504-505.
Office Action mailed Apr. 30, 2014 in Japanese Patent Application No. 2012-019726 (with English Translation).

* cited by examiner

*Primary Examiner* — Thong Q Le
(74) *Attorney, Agent, or Firm* — Oblon, Spivak, McClelland, Maier & Neustadt, L.L.P.

(57) ABSTRACT

A volatile memory area includes a plurality of second memory cells, a third select transistor, and a fourth select transistor. The plurality of second memory cells are electrically connected in series, and stacked above the substrate. The third select transistor is connected to one end of the plurality of second memory cells, and connected to a second bit line. The fourth select transistor is connected to the other end of the plurality of second memory cells, and unconnected to a second source line. A controller is configured to supply a first voltage to all gates of the second memory cells. The first voltage is capable of turning on the plurality of second memory cells.

20 Claims, 12 Drawing Sheets

READ OPERATION

WRITE OPERATION

REGION A OF CELL ARRAY CA

REGION B OF LATCH CIRCUIT LDL

SEMICONDUCTOR MEMORY DEVICE

CROSS-REFERENCE TO RELATED APPLICATIONS

This application is based upon and claims the benefit of priority from the prior Japanese Patent Application No. 2012-019726, filed on Feb. 1, 2012, the entire contents of which are incorporated herein by reference.

FIELD

Embodiments herein relate to an electrically data rewritable semiconductor memory device.

BACKGROUND

In order to improve bit density of a non-volatile semiconductor memory device such as a NAND type flash memory, a lamination of memory cells is sought for. As one scheme thereof, a laminated NAND flash memory that configures memory transistors by using vertical transistors is being proposed.

However, in the current laminated NAND flash memory, its peripheral circuits are not sufficiently integrated.

DETAILED DESCRIPTION

A semiconductor memory device according to an embodiment includes a non-volatile memory area, a volatile memory area, and a controller. The non-volatile memory area includes a plurality of first memory cells, a first select transistor, and a second select transistor. The plurality of first memory cells are electrically connected in series, and stacked above a substrate. The first select transistor is connected to one end of the plurality of first memory cells, and connected to a first bit line. The second select transistor is connected to the other end of the plurality of first memory cells, and connected to a first source line. The volatile memory area includes a plurality of second memory cells, a third select transistor, and a fourth select transistor. The plurality of second memory cells are electrically connected in series, and stacked above the substrate. The third select transistor is connected to one end of the plurality of second memory cells, and connected to a second bit line. The fourth select transistor is connected to the other end of the plurality of second memory cells, and unconnected to a second source line. The controller is configured to supply a first voltage to all gates of the second memory cells. The first voltage is capable of turning on the plurality of second memory cells. Note that, in the above, "connect" includes the meaning of "electrically connect", as well as the meaning of "directly physically connect".

Hereinbelow, a semiconductor memory device according to embodiments will be described with reference to the drawings.

[First Embodiment]
[Schematic Configuration]

Figure 1:
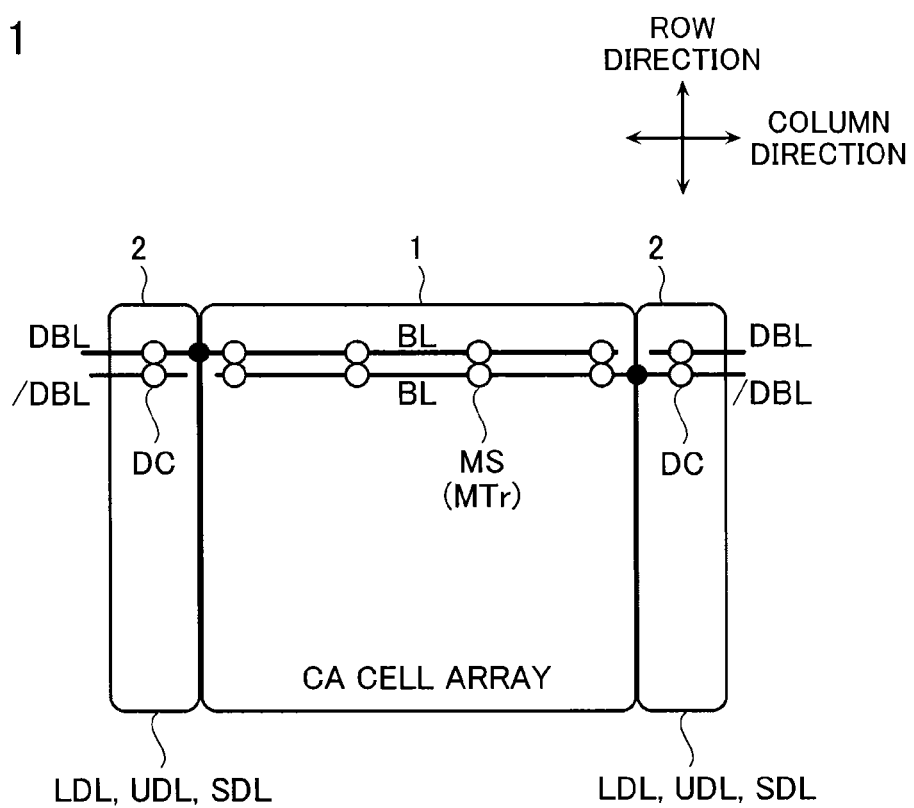
FIG. 1 is a block diagram showing a schematic configuration of a semiconductor memory device of a first embodiment.

Firstly, a schematic configuration of a semiconductor memory device of a first embodiment will be described with reference to FIG. 1. As illustrated in FIG. 1, the semiconductor memory device according to the first embodiment includes a non-volatile memory 1 such as a NAND type flash memory, and volatile memories 2 such as DRAMs arranged at both sides in a bit line BL direction. As will be described later, the non-volatile memory 1 and the volatile memories 2 have an identical three dimensional laminated structure, and are formed by an identical process. The volatile memories 2 are used as latch circuits and page buffer circuits used upon data writing and reading of the non-volatile memory 1. In this example, the non-volatile memory 1 configures a NAND type cell array CA, and the volatile memories 2 are used as latch circuits LDL, UDL, SDL that are connected to sense amplifiers upon the writing and reading of data to and from the cell array CA.

Figure 2:
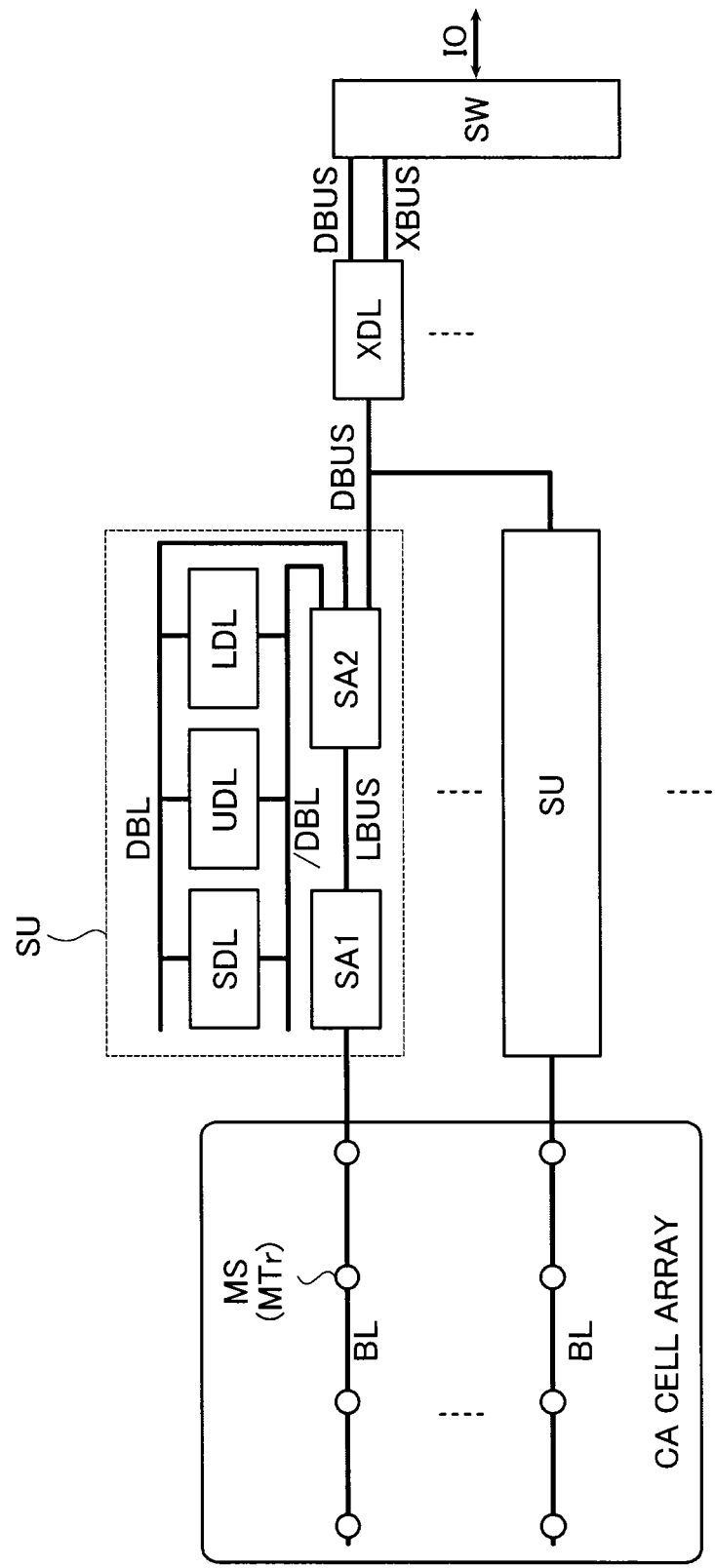
FIG. 2 is a block diagram showing a specific example of using volatile memories 2 as latch circuits according to the first embodiment.

FIG. 2 is a block diagram showing a specific example of using the volatile memories 2 as the latch circuits. This semiconductor memory device includes the cell array CA, sense amplifier units SU, latch circuits XDL, and select circuits SW.

The cell array CA is a so-called NAND type flash memory, and includes a plurality of memory strings MS that electrically store data. The memory strings MS aligned in a line are connected to one sense amplifier unit SU via one bit line BL. The memory string MS is configured of a plurality of memory transistors MTr serially connected.

The sense amplifier unit SU is connected to a latch circuit XDL via a bus DBUS. The sense amplifier unit SU includes a first sense amplifier SA1, a second sense amplifier SA2, and the latch circuits LDL, UDL, SDL.

The first sense amplifier SA1 reads data from a memory string MS (memory transistors MTr) via a bit line BL. Further, the first sense amplifier SA1 writes data to the memory transistors MTr by controlling a voltage of the bit line BL based on write data. The second sense amplifier SA2 reads data from the latch circuits LDL, UDL, SDL via a pair of bit lines DBL, /DBL, and transfers the data to the first sense amplifier SA1 via a bus LBUS. That is, two bit lines DBL, /DBL correspond to one bit line BL. Further, the second sense amplifier SA2 reads data from the latch circuit XDL via the data bus DBUS. The latch circuits LDL, UDL, SDL include a so-called DRAM structure.

The latch circuit XDL stores data received via data buses DBUS, XBUS. The select circuit SW selectively supplies an external signal I0 to the latch circuit XDL.

Figure 3:
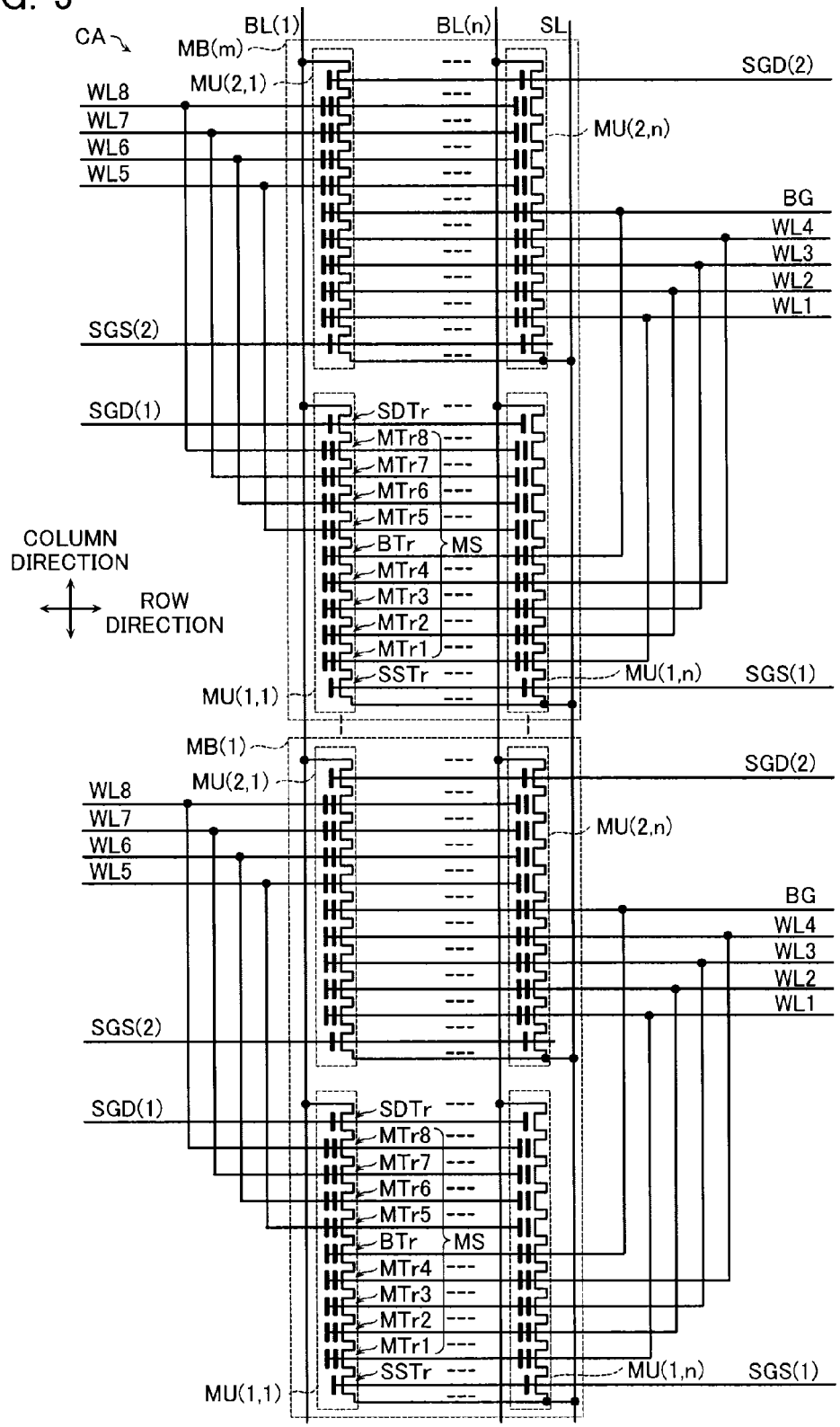
FIG. 3 is a circuit diagram showing a cell array CA according to the first embodiment.

Next, the cell array CA will be described in detail with reference to FIG. 3. As illustrated in FIG. 3, the cell array CA includes m pieces of memory blocks MB(1), ..., MB(m). Note that, hereinbelow, in a case of collectively referring to all of the memory blocks MB(1), ..., MB(m), there may be cases of describing the same as the memory blocks MB.

Each memory block MB includes memory units MU(1, 1) to MU(2, n) arranged in a matrix of n rows and 2 columns. The n rows and 2 columns is merely an example, and no limitation is made hereof. Hereinbelow, each of the memory units MU(1, 1) to MU(2, n) may simply be referred to as memory units MU without making distinctions.

One ends of the memory units MU(1, 1) to MU(2, n) are connected to bit lines BL(1) to BL(n), and the other ends of the memory units MU(1, 1) to MU 2, n) are connected to a source line SL. The bit lines BL(1) to BL(n) extend in a column direction over a plurality of memory blocks MB, and are arranged with a predetermined pitch in a row direction. Hereinbelow, in collectively referring to all of the bit lines BL(1) to BL(n), there may be cases of describing the same as the bit lines BL.

The memory unit MU includes the memory strings MS, source side select transistors SSTr, and drain side select transistors SDTr.

As illustrated in FIG. 3, the memory string MS includes memory transistors MTr1 to MTr8 serially connected (memory cells), and a back gate transistor BTr. The memory transistors MTr1 to MTr4, and MTr5 to MTr8 are serially connected, respectively. The back gate transistor BTr is connected between the memory transistor MTr4 and the memory transistor MTr5. Note that, as will be illustrated in FIGS. 7 and 8 to be described later, the memory transistors MTr1 to MTr8 are arranged three dimensionally in the row direction, the column direction, and a laminating direction (vertical direction relative to a semiconductor substrate).

The memory transistors MTr1 to MTr8 retain data by accumulating charges in their charge accumulating layers. The back gate transistor BTr is shifted to a conducting state at least in a case where the memory string MS is selected as a target of an operation.

In the memory blocks MB(1) to MB(m), word lines WL1 to WL8 are commonly connected to gates of the respective memory transistors MTr1 to MTr8 arranged in a matrix of n rows and 2 columns. A back gate line BG is commonly connected to gates of the back gate transistors BTr in the n rows and 2 columns.

A drain of the source side select transistor SSTr is connected to a source of the memory string MS. A source of the source side select transistor SSTr is connected to the source line SL. One source side select gate line SGS(1) or SGS(2) is commonly connected to the gates of the n pieces of source side select transistors SSTr aligned in a line along the row direction in the respective memory blocks MB. Note that, hereinbelow, the source side select gate lines SGS(1), (2) may collectively referred to as the source side select gate lines SGS without distinguishing.

A source of each drain side select transistor SDTr is connected to a drain of the memory string MS. A drain of the drain side select transistor SDTr is connected to a bit line BL. A drain side select gate line SGD(1) or SGD(2) is commonly connected to gates of n pieces of drain side select transistors SDTr aligned in a line in the row direction in the respective memory blocks MB. Note that, hereinbelow, the drain side select gate lines SGD(1), (2) may collectively referred to as the drain side select gate lines SGD without distinguishing.

Figure 4:
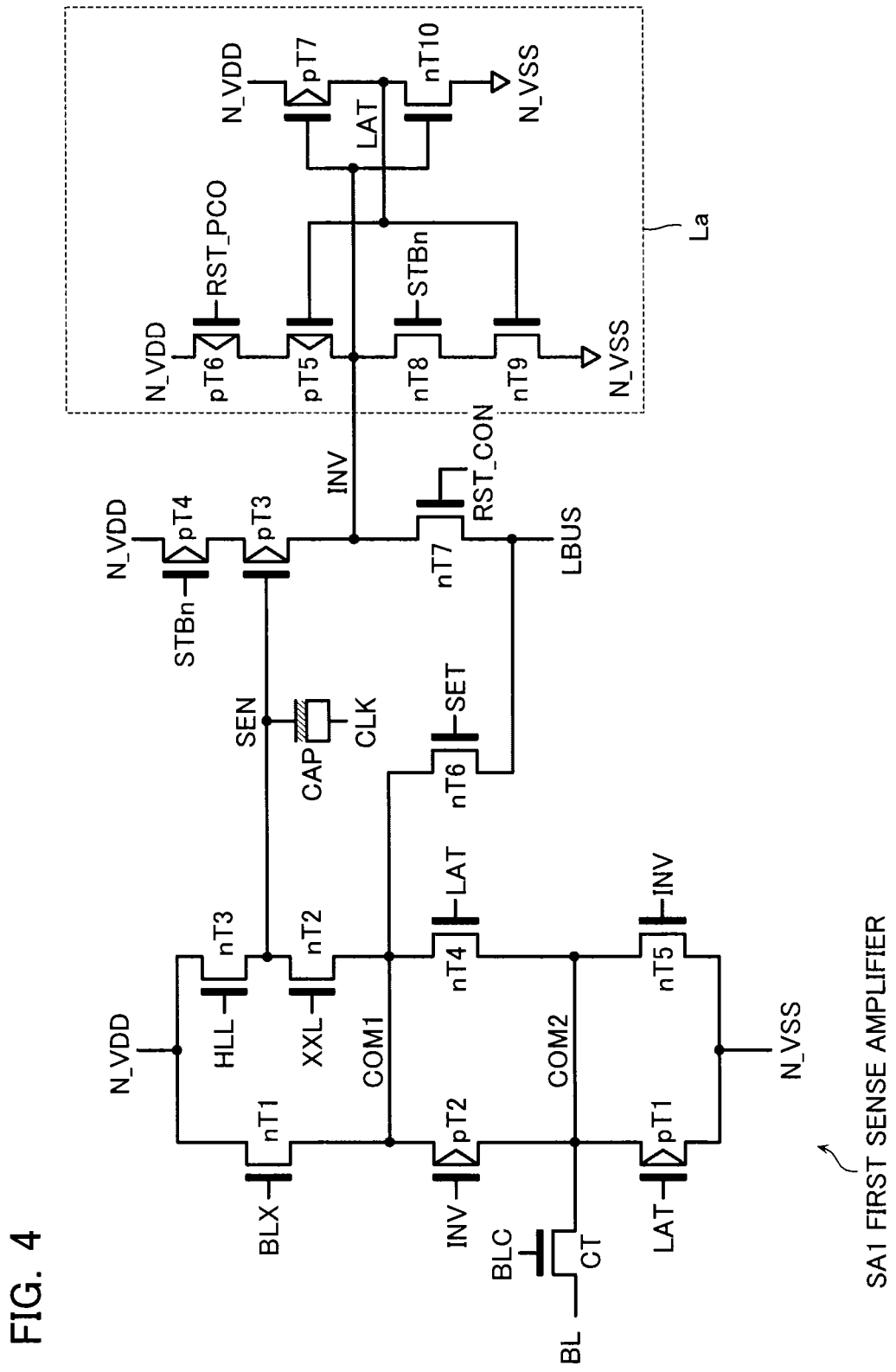
FIG. 4 is a circuit diagram showing a first sense amplifier SA1 according to the first embodiment.

Next, the first sense amplifier SA1 will be described in detail with reference to FIG. 4. As illustrated in FIG. 4, the first sense amplifier SA1 includes a clamping transistor CT, nMOS transistors nT1 to nT7, pMOS transistors pT1 to pT4, a capacitor CAP, and a latch circuit La.

The clamping transistor CT has one end of its current path connected to the bit line BL, and the other end connected to a node COM2. The clamping transistor CT has a gate applied voltage BLC. The clamping transistor CT transfers a voltage that is determined based on the voltage BLC and a voltage of the node COM2 to the bit line BL. The capacitor CAP is connected to a sense node SEN. A precharging MOS transistor nT3 is driven by a signal HLL, and connected between a power node N_VDD and the sense node SEN. A charge transferring MOS transistor nT2 is driven by a signal XXL, and connected between the sense node SEN and a node COM1. A continuous current supplying MOS transistor nT1 is connected between the power node N_VDD and the node COM1. MOS transistors pT2, nT4 that are driven by data latched in the latch circuit La, and connected in parallel between the node COM1 and the node COM2. MOS transistors pT1, nT5 operates with inversed on/off relative to the MOS transistors pT2, nT4, and connected in parallel between the node COM2 and a ground node N_VSS. The setting transistor nT6 transfers data of LBUS to COM1 based on a set signal SET.

A MOS transistor pT3 having its gate connected to the sense node SEN. A MOS transistor pT4 is connected between the MOS transistor pT3 and the power node N_VDD, and driven by a strobe signal STBn. A MOS transistor nT7 is connected between the MOS transistor pT3 and the ground node N_VSS, and driven by a reset signal RST_CON. The MOS transistor pT3, pT4, and nT7 configure a discriminator circuit that discriminates a level of the sense node SEN. An output of this discriminator circuit is inputted to a node INV of the latch circuit La.

The latch circuit La is configured by cross coupling a first inverter and a second inverter. The first inverter is configured of MOS transistors pT5, nT9 that are connected complementarily symmetrical between the power node N_VDD and the ground node N_VSS. The second inverter is similarly configured of MOS transistors pT7, nT10, and retains data at nodes INV, LAT that are logically converse to one another. MOS transistors pT6, nT8 are respectively driven by a reset signal RST_PCO and the strobe signal STBn, and are serially connected to the MOS transistors pT5, nT9.

In the above configuration, upon writing data, write data is given to the latch circuit La. The first sense amplifier SA1 corresponding to a selected bit line BL has the node INV="H", and the node LAT="L". Thus, the MOS transistors pT2, nT4 are in a nonconductive state and the MOS transistors nT5, pT1 are in a conductive state, and VSS (0V) is given to the selected bit line BL. The first sense amplifier SA1 corresponding to an unselected bit line BL has the node INV="L", and the node LAT="H". Thus, the MOS transistors nT5, pT1 are in the nonconductive state and the MOS transistors nT4, pT2 are in the conductive state. As a result, the unselected bit line BL is charged to the power voltage VDD by the MOS transistor nT1.

Upon reading data, the bit line BL is charged to a predetermined potential via a current path of the MOS transistor nT1, the MOS transistors pT2, nT4, and the nodes COM1, COM2. Further, the capacitor CAP is charged by the MOS transistor nT3, and a potential of the sense node SEN rises close to the power voltage N_VDD.

Here, when the MOS transistor nT2 is shifted to an on state, a current flows in the bit line BL responsive to data in a selected memory transistor, whereby the voltage of the sense node SEN is caused to vary. Accordingly, data can be read from the selected memory transistor by detecting the voltage of the sense node SEN. That is, if the selected memory transistor is in the conductive state, the potential of the sense node SEN is lowered, and the MOS transistor pT3 shifts to the conductive state. As a result, the node INV is shifted to "H", and the node LAT is shifted to "L". Further, the MOS transistors pT1, nT5 come to be in the conductive state, and the bit line BL is fixed to VSS (0V). On the other hand, if the selected memory transistor is in the nonconductive state, the potential of the sense node SEN is not lowered, and the MOS transistor pT3 is in the nonconductive state. Thus, the node INV is maintained at "L", and the node LAT is maintained at "H". In this case, current supply to the bit line BL continues via the MOS transistors nT1, pT2, and nT4.

Next, the latch circuit LDL and the second sense amplifier SA2 will be described in detail with reference to FIG. 5. Note that, although FIG. 5 only illustrates the latch circuit LDL, the latch circuits UDL, SDL have similar configuration as the latch circuit LDL.

Figure 5:
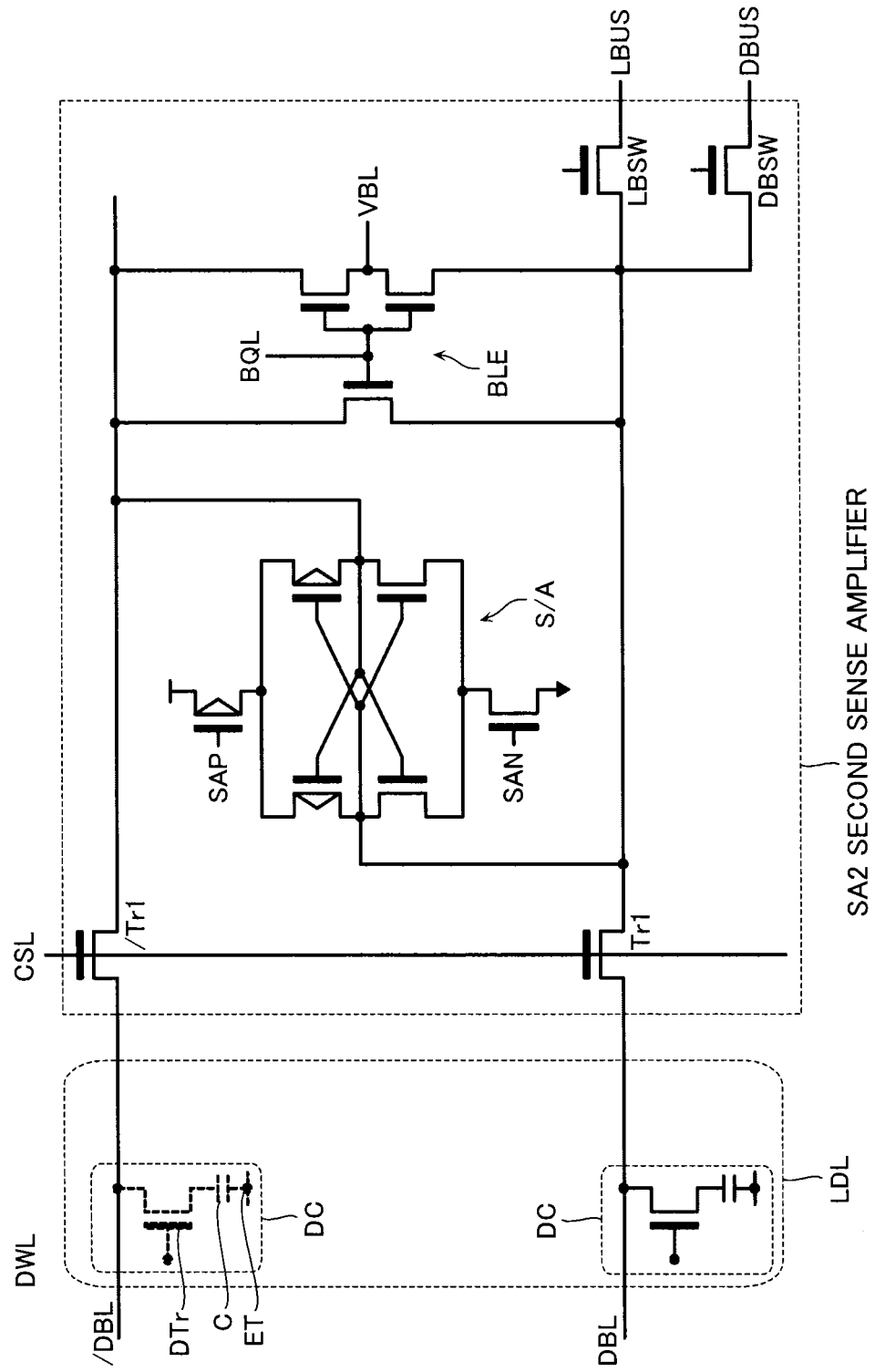
FIG. 5 is a circuit diagram showing a latch circuit LDL and a second sense amplifier SA2 according to the first embodiment.

As illustrated in FIG. 5, the latch circuit LDL includes memory cells DC configuring a pair of cells. The memory cell DC includes the DRAM structure including a transistor DTr, a capacitor C, and a terminal ET. The memory cell DC selectively shifts the transistor DTr to be in a conductive or nonconductive state, and writes data to the capacitor C or reads data from the capacitor C. The memory cell DC connected to a bit line DBL and the memory cell DC connected to a bit line /DBL store data different from one another, and are driven by the same word line DWL. One end of each capacitor C is connected to the bit line DBL or /DBL via the transistor DTr, and the other end is connected to the terminal ET to which a predetermined fixed voltage is given.

As illustrated in FIG. 5, the second sense amplifier SA2 includes a differential amplifier S/A, an equalizer BLE, column select transistors Tr1, /Tr1, and bus select transistors LBSW, DBSW.

The differential amplifier S/A is operated by driving signals SAN, SAP, and amplifies a potential difference between the bit lines DBL, /DBL corresponding to data. The equalizer BLE fixes the bit lines DBL, /DBL at an intermediate potential voltage VBL responsive to a signal BQL prior to a sensing operation. The transistors Tr1, /Tr1 are driven by a selected column line CSL, and transfers the voltages of the bit lines DBL, /DBL to the differential amplifier S/A.

The transistors LBSW, DBSW respectively connect the bit line DBL with buses LBUS, DBUS.

[Operations]

Figure 6A:
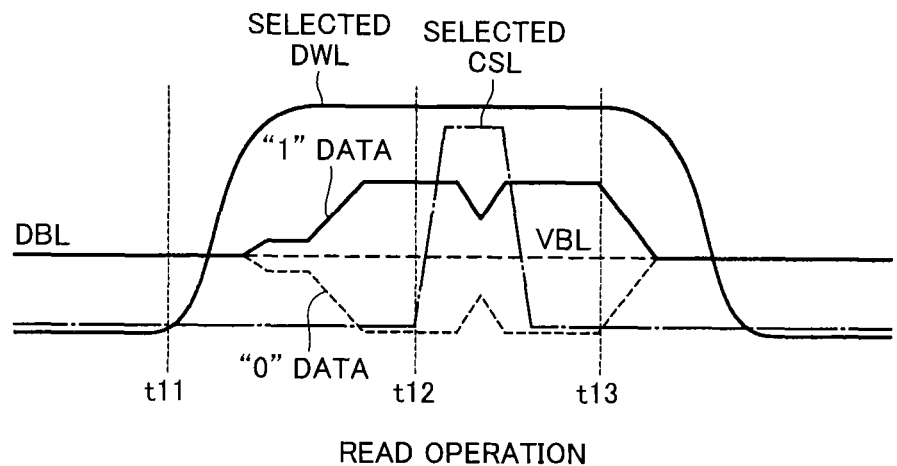
FIGS. 6A and 6B are timing charts showing a read operation and a write operation to the latch circuit LDL according to the first embodiment.
Figure 6B:
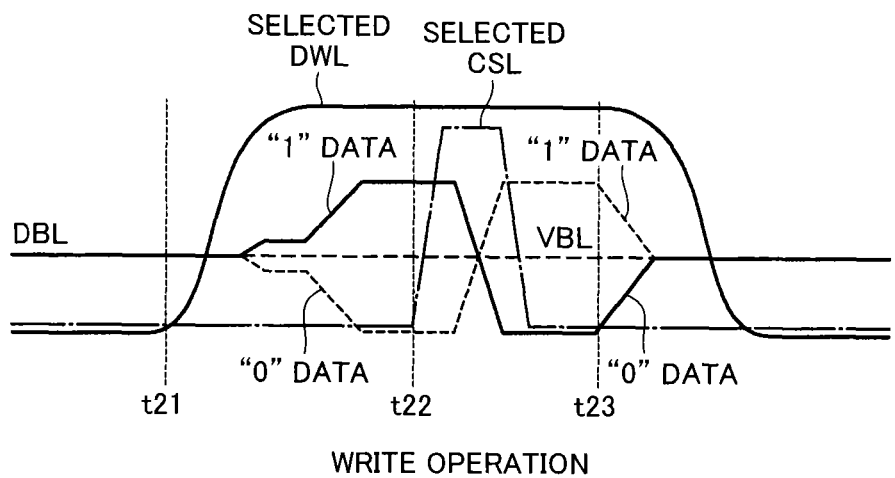

The read operation and the write operation to the latch circuits LDL, UDL, SDL will be described with reference to FIGS. 6A and 6B.

Firstly, the read operation will be described with reference to FIG. 6A. As illustrated in FIG. 6A, at time t11, when the potential of the selected word line DWL rises, a potential difference corresponding to data ("0" or "1") of the memory cells DC connected to the selected word line DWL is generated between the pair of bit lines DBL, /DBL. As illustrated in FIG. 6A, the voltage of the bit line DBL rises by a discharge from the capacitor C in the case of "1" data. On the other hand, the voltage of the bit line DBL falls in the case of "0" data by the charging to the capacitor C. Next, at time t12, the voltage of the selected column line CSL is raised for the differential amplifier S/A to read the potential difference between the pair of bit lines DBL, /DBL (data of the memory cells DC). Thereafter, at time t13, the potential of the selected word line DWL is lowered.

Next, the write operation will be described with reference to FIG. 6B. As illustrated in FIG. 6B, at time t21, when the potential of the selected word line DWL rises, a potential difference corresponding to data ("0" or "1") of the memory cells DC connected to the selected word line DWL is generated between the pair of bit lines DBL, /DBL. Next, at time t22, the voltage of the selected column line CSL is raised. At this occasion, write data is transferred to a bit line DBL from DBUS via the transistor DBSW. Due to this, the write data is transferred to the pair of bit lines DBL, /DBL to which the memory cells DC is connected via the transistors Tr1, /Tr1, and the data is written to the memory cells DC. In the example shown in the drawing, a case where the data of the memory cell DC is rewritten from "1" to "0" is shown, and since the voltage of the bit line DBL is at the "L" level, the charges in the capacitor C of the memory cell DC connected to the bit line DBL is discharged, and the data is inverted. On the other hand, on the bit line /DBL side, the data of the memory cell DC is rewritten from "0" to "1". In this case, the capacitor C of the memory cell DC connected to the bit line /DBL is charged by the voltage of the bit line /DBL. Thereafter, at time t23, the potential of the selected word line DWL is lowered.

[Laminated Structure]

Figure 7:
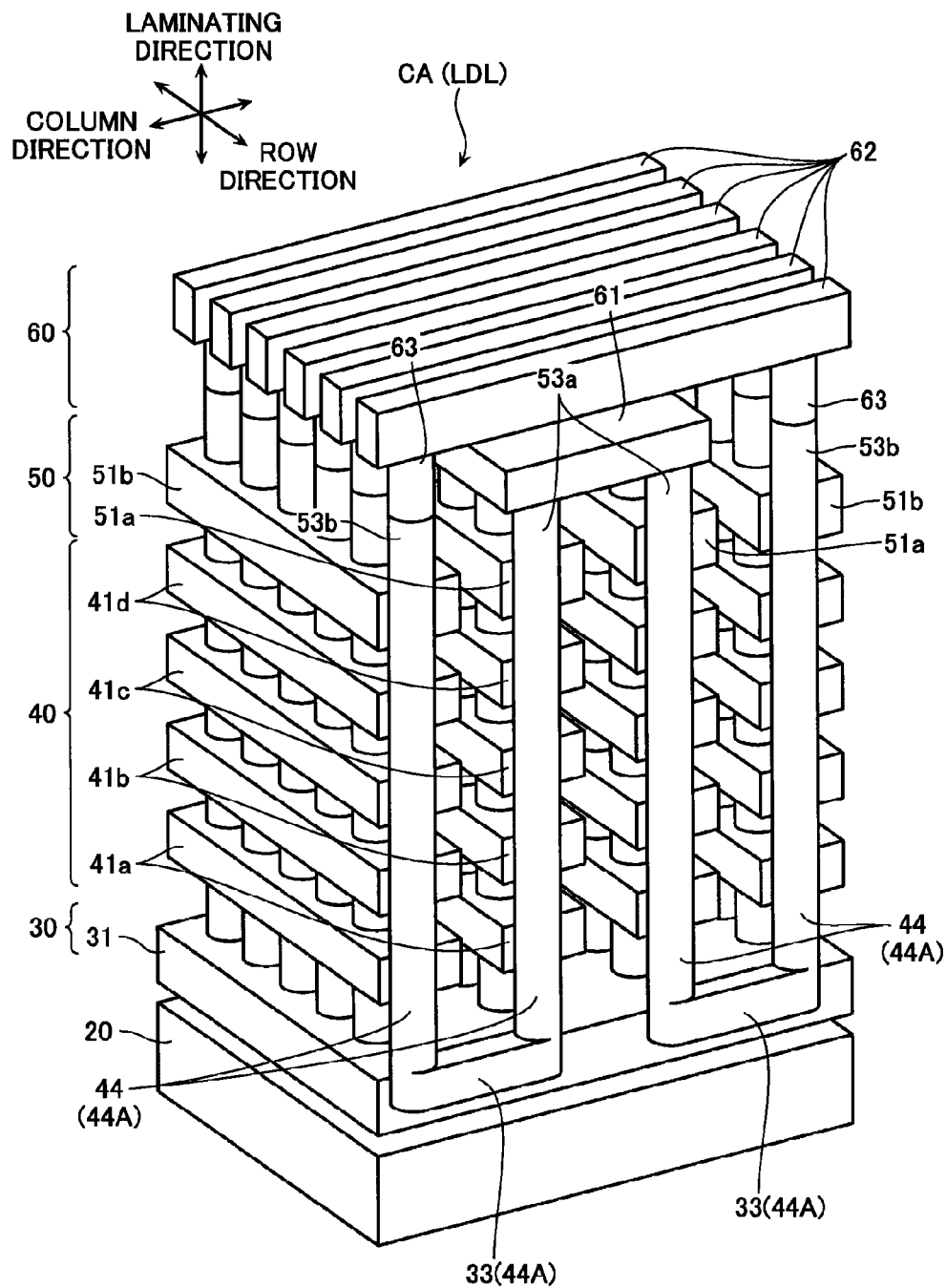
FIG. 7 is a perspective diagram of the cell array CA and the latch circuit LDL according to the first embodiment.
Figure 8:
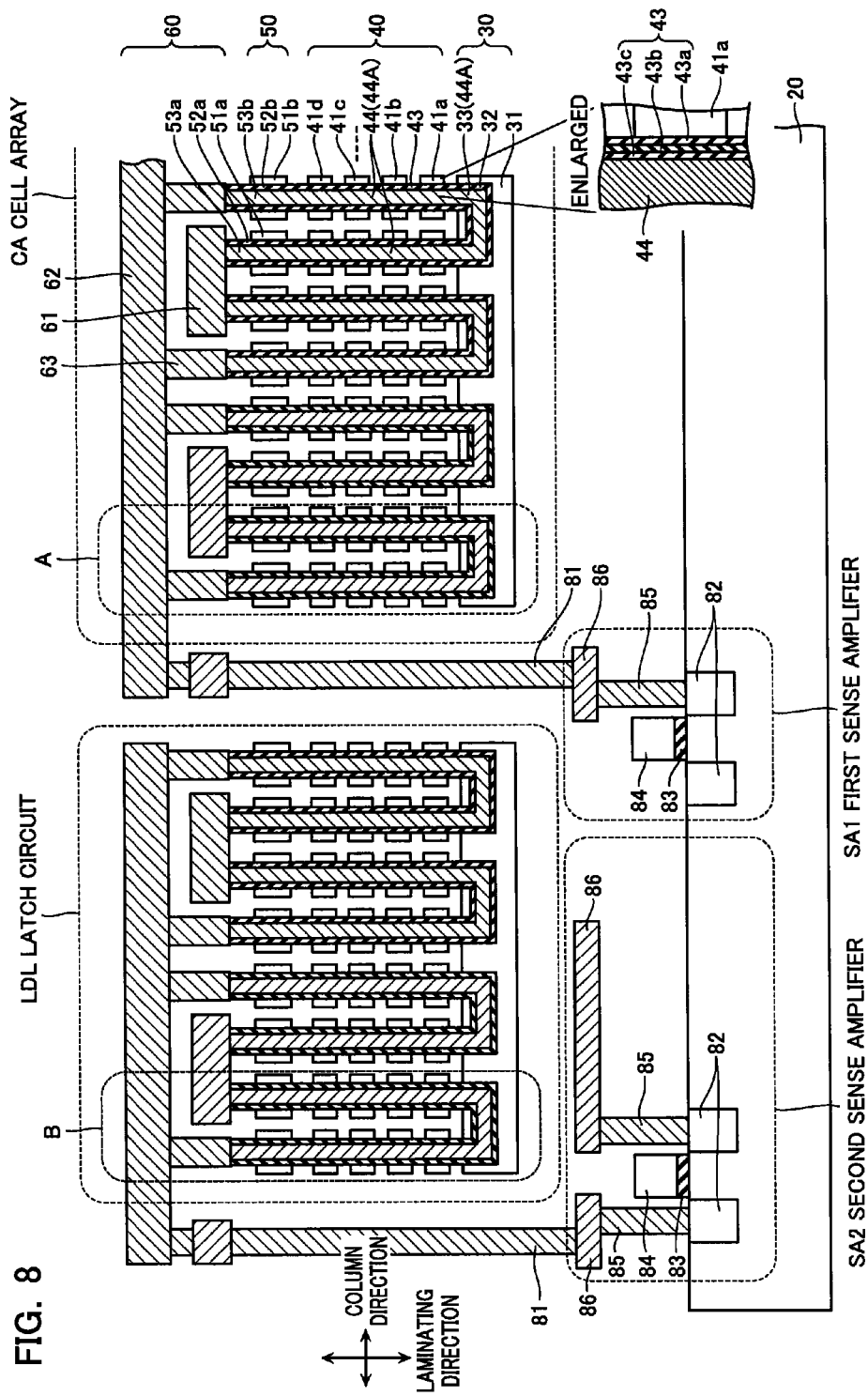
FIG. 8 is a cross sectional diagram of the semiconductor memory device according to the first embodiment.

Next, a laminated structure of the semiconductor memory device of the present embodiment will specifically be described. FIG. 7 is a perspective diagram of the cell array CA and the latch circuit LDL, and FIG. 8 is a cross sectional diagram of the cell array CA and the latch circuit LDL. Note that, although the following description refers only to the latch circuit LDL, the latch circuits UDL, SDL have similar configuration as the latch circuit LDL.

As illustrated in FIGS. 7 and 8, the cell array CA includes a back gate layer 30, a memory layer 40, a select transistor layer 50, and a wiring layer 60 orderly laminated on a semiconductor substrate 20. The back gate transistor BTr is formed in the back gate layer 30. The memory transistors MTr1 to MTr8 are formed in the memory layer 40. The drain side select transistor SDTr and the source side select transistor SSTr are formed in the select transistor layer 50. The source line SL and the bit line BL are formed in the wiring layer 60.

As illustrated in FIGS. 7 and 8, the back gate layer 30 includes a back gate conductive layer 31. The back gate conductive layer 31 is formed for example of polysilicon (poly-Si), and functions as a back gate line BG and a gate of the back gate transistor BTr. The back gate conductive layer 31 is formed to expand two dimensionally in the row direction and the column direction parallel to the semiconductor substrate 20.

Further, As illustrated in FIG. 8, the back gate layer includes a memory gate insulating layer 32, and a semiconductor layer 33. The semiconductor layer 33 functions as a body (channel) of the back gate transistor BTr.

The memory gate insulating layer 32 makes contact with a side surface of the back gate conductive layer 31. The semiconductor layer 33 sandwiches the memory gate insulating layer 32 with the back gate conductive layer 31. That is, the back gate conductive layer 31 surrounds a side surface and a lower surface of the semiconductor layer 33 via the memory gate insulating layer 32.

The semiconductor layer 33 functions as the body (channel) of the back gate transistor BTr, and is formed so as to carve into the back gate conductive layer 31. The semiconductor layer 33 is formed for example of polysilicon (poly-Si)

in a substantially rectangular shape with its longitudinal direction along the column direction as seen from a top surface, and is formed in a matrix shape in the row direction and the column direction within one memory block MB.

As illustrated in FIGS. 7 and 8, the memory layer 40 is formed as an upper layer of the back gate layer 30. The memory layer 40 includes four layers of word line conductive layers 41a to 41d. The word line conductive layers 41a function as the word lines WL4, WL5, and gates of the memory transistors MTr4, MTr5. Similarly, the word line conductive layers 41b to 41d respectively function as the word lines WL1 to WL3, WL6 to WL8 and gates of the memory transistors MTr1 to MTr3 and MTr6 to MTr8.

The word line conductive layers 41a to 41d are laminated with interlayer insulating layers sandwiched at above and under. The word line conductive layers 41a to 41d are formed for example of polysilicon (poly-Si) with their longitudinal direction along the row direction, and arranged with pitches in the column direction.

As illustrated in FIG. 8, the memory layer 40 includes memory gate insulating layers 43 and columnar shaped semiconductor layers 44. The columnar shaped semiconductor layers 44 function as bodies (channels) of the memory transistors MTr1 to MTr8.

The memory gate insulating layers 43 are formed between the columnar shaped semiconductor layer 44 and the word line conductive layers 41a to 41d and continuously and integrally with the aforementioned memory gate insulating layer 32. The memory gate insulating layer 43 includes a block insulating layer 43a, a charge accumulating layer 43b, and a tunnel insulating layer 43c, respectively having predetermined thicknesses, from a side of the side surfaces of the word line conductive layers 41a to 41d toward a side of the columnar shaped semiconductor layer 44. The charge accumulating layer 43b is configured capable of accumulating charges. The block insulating layer 43a and the tunnel insulating layer 43c are configured for example of silicon oxide ($SiO_2$). The charge accumulating layer 43b is configured for example of silicon nitride (SiN).

The columnar shaped semiconductor layers 44 penetrate the word line conductive layers 41a to 41d. That is, the word line conductive layers 41a to 41d surround the side surfaces of the columnar shaped semiconductor layers 44 via the memory gate insulating layers 43. The columnar shaped semiconductor layers 44 extend in a vertical direction relative to the semiconductor substrate 20. The pair of columnar shaped semiconductor layers 44 is formed continuously and integrally with the aforementioned semiconductor layer 33, and is aligned in the vicinity of end portions of the semiconductor layer 33 in the column direction. The columnar shaped semiconductor layers 44 are configured for example of polysilicon (poly-Si).

In the back gate layer 30 and the memory layer 40 as above described, the pair of columnar shaped semiconductor layers 44, and the semiconductor layer 33 connecting lower ends of the pair configure a memory semiconductor layer 44A that function as a body (channel) of the memory string MS. The memory semiconductor layer 44A is formed in a U shape as seen from the row direction.

As illustrated in FIGS. 7 and 8, the select transistor layer 50 includes a source side conductive layer 51a and a drain side conductive layer 51b. The source side conductive layer 51a functions as the source side select gate line SGS, and the gate of the source side select transistor SSTr. The drain side conductive layer 51b functions as the drain side select gate line SGD, and the gate of the drain side select transistor SDTr.

The source side conductive layer 51a is formed as an upper layer of one of the columnar shaped semiconductor layers 44 configuring the memory semiconductor layer 44A. The drain side conductive layer 51b is in the same layer as the source side conductive layer 51a, and is formed as an upper layer of the other of the columnar shaped semiconductor layers 44 configuring the memory semiconductor layer 44A. Pluralities of source side conductive layers 51a and drain side conductive layers 51b are formed for example with polysilicon (poly-Si), extending in the row direction, and arranged with predetermined pitches in the column direction.

As illustrated in FIG. 8, the select transistor layer 50 includes a source side gate insulating layer 52a, a source side columnar shaped semiconductor layer 53a, a drain side gate insulating layer 52b, and a drain side columnar shaped semiconductor layer 53b. The source side columnar shaped semiconductor layer 53a functions as a body (channel) of the source side select transistor SSTr. The drain side columnar shaped semiconductor layer 53b functions as a body (channel) of the drain side select transistor SDTr.

The source side gate insulating layer 52a is formed for example of silicon oxide ($SiO_2$) so as to contact a side surface of the source side conductive layer 51a.

The source side columnar shaped semiconductor layer 53a sandwiches the source side gate insulating layer 52a with the source side conductive layer 51a. The source side columnar shaped semiconductor layer 53a penetrates the source side conductive layer 51a. That is, the source side conductive layer 51a surrounds the side surface of the source side columnar shaped semiconductor layer 53a via the source side gate insulating layer 52a. The source side columnar shaped semiconductor layer 53a is connected to a top surface of one of the pair of columnar shaped semiconductor layers 44, and is formed in a columnar shape extending in the vertical direction relative to the semiconductor substrate 20. The source side columnar shaped semiconductor layers 53a are formed for example of polysilicon (poly-Si).

The drain side gate insulating layer 52b is formed for example of silicon oxide ($SiO_2$) so as to make contact with a side surface of the drain side conductive layer 51b.

The drain side columnar shaped semiconductor layer 53b sandwiches the drain side gate insulating layer 52b with the drain side conductive layer 51b. The drain side columnar shaped semiconductor layer 53b penetrates the drain side conductive layer 51b. That is, the drain side conductive layer 51b surrounds aside surface of the drain side columnar shaped semiconductor layer 53b via the drain side gate insulating layer 52b. The drain side columnar shaped semiconductor layer 53b is connected to a top surface of the other of the pair of columnar shaped semiconductor layers 44, and is formed in a columnar shape extending in the vertical direction relative to the semiconductor substrate 20. The drain side columnar shaped semiconductor layer 53b is formed for example of polysilicon (poly-Si).

The wiring layer 60 includes a source line layer 61, a bit line layer 62, and a plug layer 63. The source line layer 61 functions as the source line SL. The bit line layer 62 functions as the bit line BL.

The source line layer 61 makes contact with a top surface of the source side columnar shaped semiconductor layer 53a, and extends in the row direction. The bit line layer 62 makes contact with a top surface of the drain side columnar shaped semiconductor layer 53b via the plug layer 63, and extends in the column direction. The source line layer 61, the bit line layer 62, and the plug layer 63 are configured for example of metal such as tungsten.

Next, the latch circuit LDL will be described. As illustrated in FIGS. 7 and 8, the latch circuit LDL has the laminated structure similar to the cell array CA. That is, similar to the cell array CA, the latch circuit LDL includes a back gate layer 30, a memory layer 40, a select transistor layer 50, and a wiring layer 60. As illustrated in FIG. 1, the latch circuit LDL is formed to be adjacent to the cell array CA in a direction along which the bit lines BL extend. The bit lines DBL, /DBL connected to the latch circuit LDL have the same pitch as the bit lines BL of the cell array CA.

Note that, aback gate conductive layer 31 in the latch circuit LDL is formed to be in the same layer as the back gate conductive layer 31 in the cell array CA. Word line conductive layers 41a to 41d in the latch circuit LDL are formed to be in the same layers as the word line conductive layers 41a to 41d in the cell array CA. A source side conductive layer 51a and a drain side conductive layer 51b in the latch circuit LDL are formed to be in the same layers as the source side conductive layer 51a and the drain side conductive layer 51b in the cell array CA.

As illustrated in FIG. 8, the first and second sense amplifiers SA1, SA2 are positioned in a lower layer of the latch circuit LDL, and are formed on the semiconductor substrate 20. The first and second sense amplifiers SA1, SA2 are respectively electrically connected with the bit line layer 62 via contacts 81 extending in the laminating direction.

The first and second sense amplifiers SA1, SA2 each includes a pair of diffusing layers 82, a gate insulating layer 83, and a conductive layer 84. The pair of diffusing layers 82 is formed on the surface of the semiconductor substrate 20, and functions as source and drain of the transistor. One of the pair of diffusing layers 82 is connected to the contact 81 via a plug layer 85 and a wiring layer 86. The gate insulating layer 83 is formed on the semiconductor substrate 20 so as to cross over the pair of diffusing layers 82. The conductive layer 84 is formed on the gate insulating layer 83, and functions as a gate of the transistor.

Figure 9:
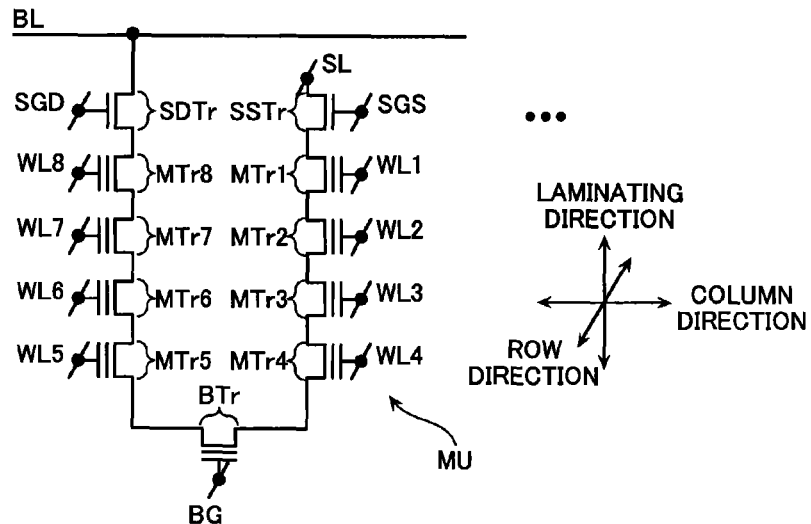
FIG. 9 is an equivalent circuit diagram of a region A of FIG. 8.

According to the above laminated structure, a region A of the cell array CA shown in FIG. 8 functions as a memory unit MU (memory string MS, source side select transistor SSTr, drain side select transistor SDTr) illustrated in FIG. 9. As illustrated in FIG. 9, the memory string MS bends in a U shape as seen from the row direction. The voltages to be applied to the gates of the respective transistors MTr1 to MTr8, BTr, SSTr, SDTr are controlled independently. Due to this, the respective transistors MTr1 to MTr8, BTr, SSTr, SDTr are shifted to either the conductive state or the nonconductive state, whereby writing, reading, and erasing of data to the memory transistors MTr1 to MTr8 are performed.

Figure 10:
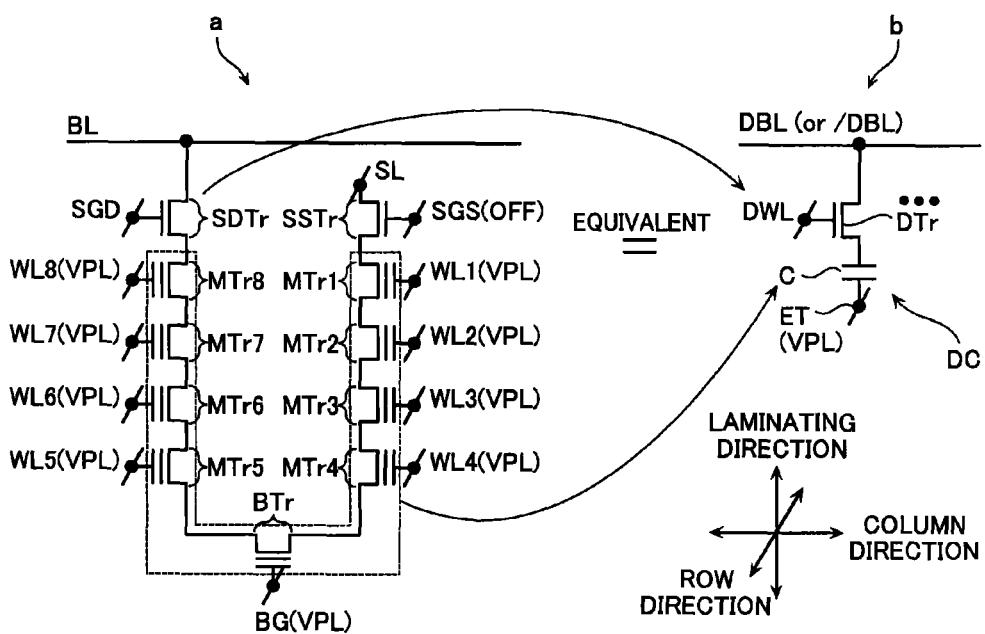
FIG. 10 is an equivalent circuit diagram of a region B of FIG. 8.

Further, by the above laminated structure, a region B of the latch circuit LDL illustrated in FIG. 8 may function as the memory unit MU illustrated in "a" of FIG. 10. However, in the latch circuit LDL, a fixed potential VPL is supplied to the gates of the memory transistors MTr1 to MTr8 and the gate of the back gate transistor BTr. As the fixed potential VPL, a voltage that causes the memory transistor MTr1 to be in the on state is desirable from the aspect of being capable of increasing a channel capacity. Further, the source side select transistor SSTr is controlled to be always in the nonconductive state (OFF) by a gate voltage, and the source side columnar shaped semiconductor layer 53a and the source line layer 61 become electrically unconnected. By these controls, the region B of the latch circuit LDL illustrated in FIG. 8 functions as the memory cell DC (DRAM) shown in "b" of FIG. 10. That is, As illustrated in "b" of FIG. 10, the body of the memory string MS (the memory transistors MTr1 to MTr8 and the back gate transistor BTr) functions as the capacitor C of the memory cell DC. The gates of the memory transistors MTr1 to MTr8 and the back gate transistor BTr function as the terminal ET that supplies the fixed potential to the one end of the capacitor C. The drain side select transistor SDTr functions as the transistor DTr that is controlled to be in the conductive or nonconductive state in accordance with the operation of the memory cell DC. The drain side select gate line SGD functions as the word line DWL. The bit line BL functions as the bit line DBL (or /DBL).

Further, the laminated structure of the latch circuit LDL shown in FIG. 8 functions as follows. That is, in the latch circuit LDL, the drain side columnar shaped semiconductor layer 53b functions as the body of the transistor DTr. The drain side conductive layer 51b functions as the gate of the transistor DTr, and the word line DWL. The memory semiconductor layer 44A functions as the capacitor C. The back gate conductive layer 31 and the word line conductive layers 41a to 41d function as the terminal ET connected to the one end of the capacitor C.

According to the latch circuit LDL of the present embodiment, the capacitor C of the memory cell DC can be configured by the memory semiconductor layer 44A that extends in the laminating direction. Due to this, even if the memory cell pitch in the cell array CA is made finer, a sufficient capacity can be ensured. That is, the latch circuit LDL of the first embodiment can significantly reduce an occupying area and an operating area can be increased.

Further, in the present embodiment, the latch circuit LDL is positioned in the same layer as the cell array CA, and the first and second sense amplifiers SA1, SA2 are positioned in the lower layer of the latch circuits LDL, UDL, SDL. Due to this, the first embodiment can secure space in the lower layer of the cell array CA, and other circuits can be arranged in that space. Further, the cell array CA and the latch circuits LDL, UDL, SDL can be formed in the same process.

[Second Embodiment]

Figure 11:
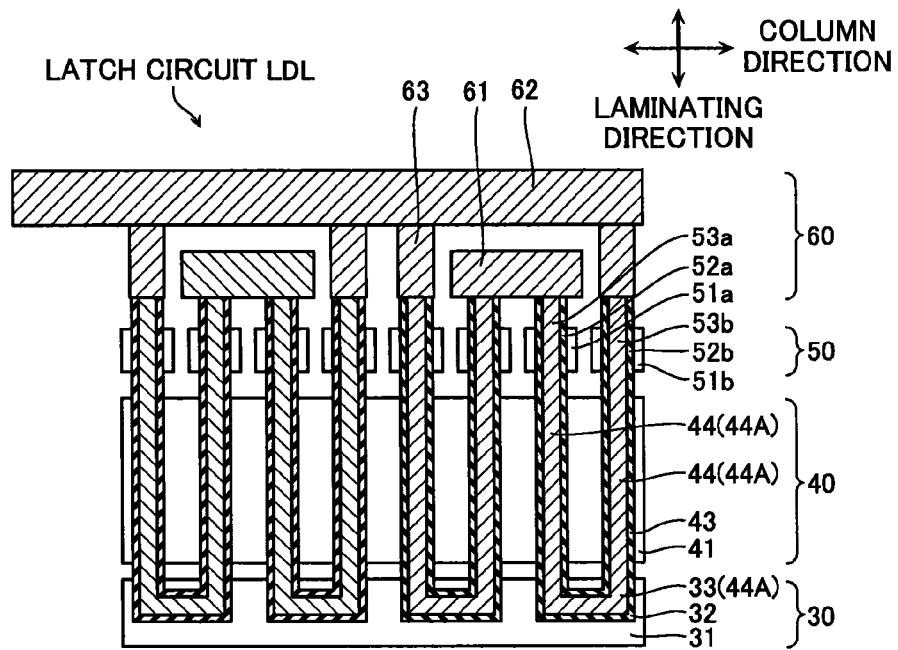
FIG. 11 is a cross sectional diagram of a latch circuit LDL according to a second embodiment.

Next, a semiconductor memory device according to a second embodiment will be described with reference to FIG. 11. FIG. 11 illustrates only a laminated structure of a latch circuit LDL. Note that, in the second embodiment, a laminated structure of a cell array CA is similar to the first embodiment.

As illustrated in FIG. 11, the latch circuit LDL according to the second embodiment includes one layer of word line conductive layer 41 instead of the word line conductive layers 41a to 41d. The word line conductive layer 41 is formed continuously from a position of a lower end of the word line conductive layer 41a to a position of an upper end of the word line conductive layer 41d in the cell array CA.

The above mentioned word line conductive layer 41 can make a capacity with a memory semiconductor layer 44A larger than with the word line conductive layers 41a to 41d. Due to this, the second embodiment improves data retention of memory cells DC than in the first embodiment. Further, the second embodiment can simplify a manufacturing process than in the first embodiment.

[Third Embodiment]

Figure 12:
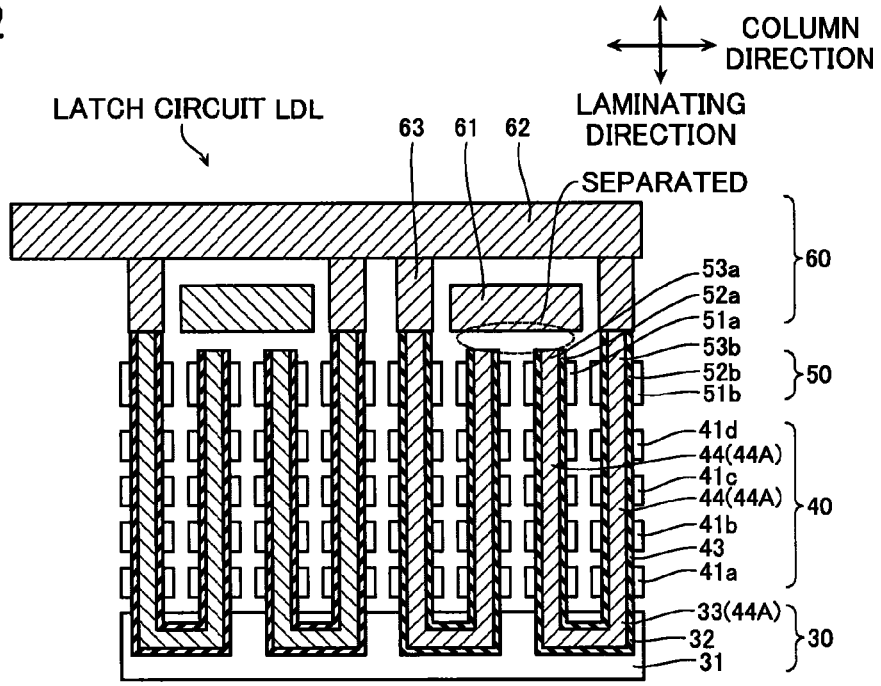
FIG. 12 is across sectional diagram of a latch circuit LDL according to a third embodiment.

Next, a semiconductor memory device according to a third embodiment will be described with reference to FIG. 12. FIG. 12 illustrates only a laminated structure of a latch circuit LDL. Note that, in the third embodiment, a laminated structure of a cell array CA is similar to the first embodiment.

As illustrated in FIG. 12, in the latch circuit LDL of the third embodiment, a source side columnar shaped semiconductor layer 53a is physically separated from a source line layer 61. Due to this, in the third embodiment, a source side select transistor SSTr in the latch circuit LDL does not need to be controlled to be in a nonconductive state as in the first embodiment. Further, a leak current from a capacitor C to the source line layer 61 can be suppressed.

[Fourth Embodiment]

Figure 13:
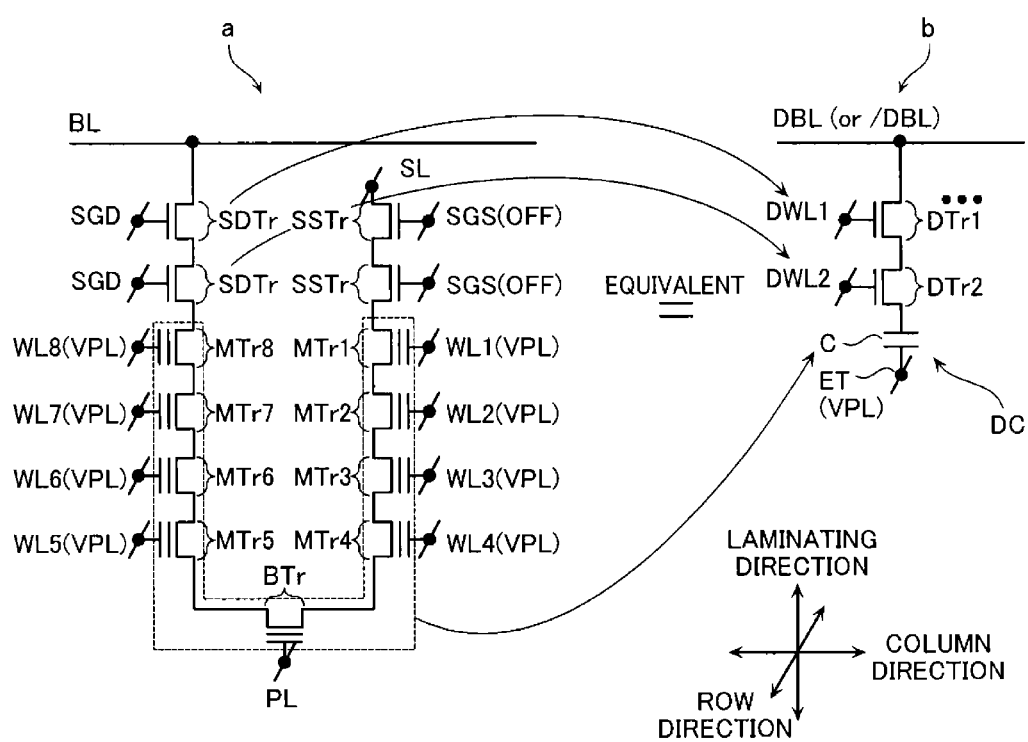
FIG. 13 is an equivalent circuit diagram of a latch circuit LDL according to a fourth embodiment.

Next, a semiconductor memory device according to a fourth embodiment will be described with reference to FIG. 13. FIG. 13 illustrates a circuit configuration of a latch circuit LDL. Note that, in the fourth embodiment, a circuit configuration of a cell array CA is similar to the first embodiment.

As illustrated in "a" and "b" of FIG. 13, a memory cell DC of the fourth embodiment includes two transistors DTr1, DTr2 serially connected to a capacitor, and differs from the first embodiment in this respect.

The configuration shown in FIG. 13 is realized for example by laminating two layers of select transistor layer 50, or using memory transistors MTri of an upper layer as memory transistors DTr. A leak current from a bit line DBL (or /DBL) to a capacitor C can be suppressed by the serially connected transistors DTr1, DTr2 than in the first embodiment. A number of the serially connected transistors DTr is not limited to two, and may further be increased.

[Fifth Embodiment]

Figure 14:
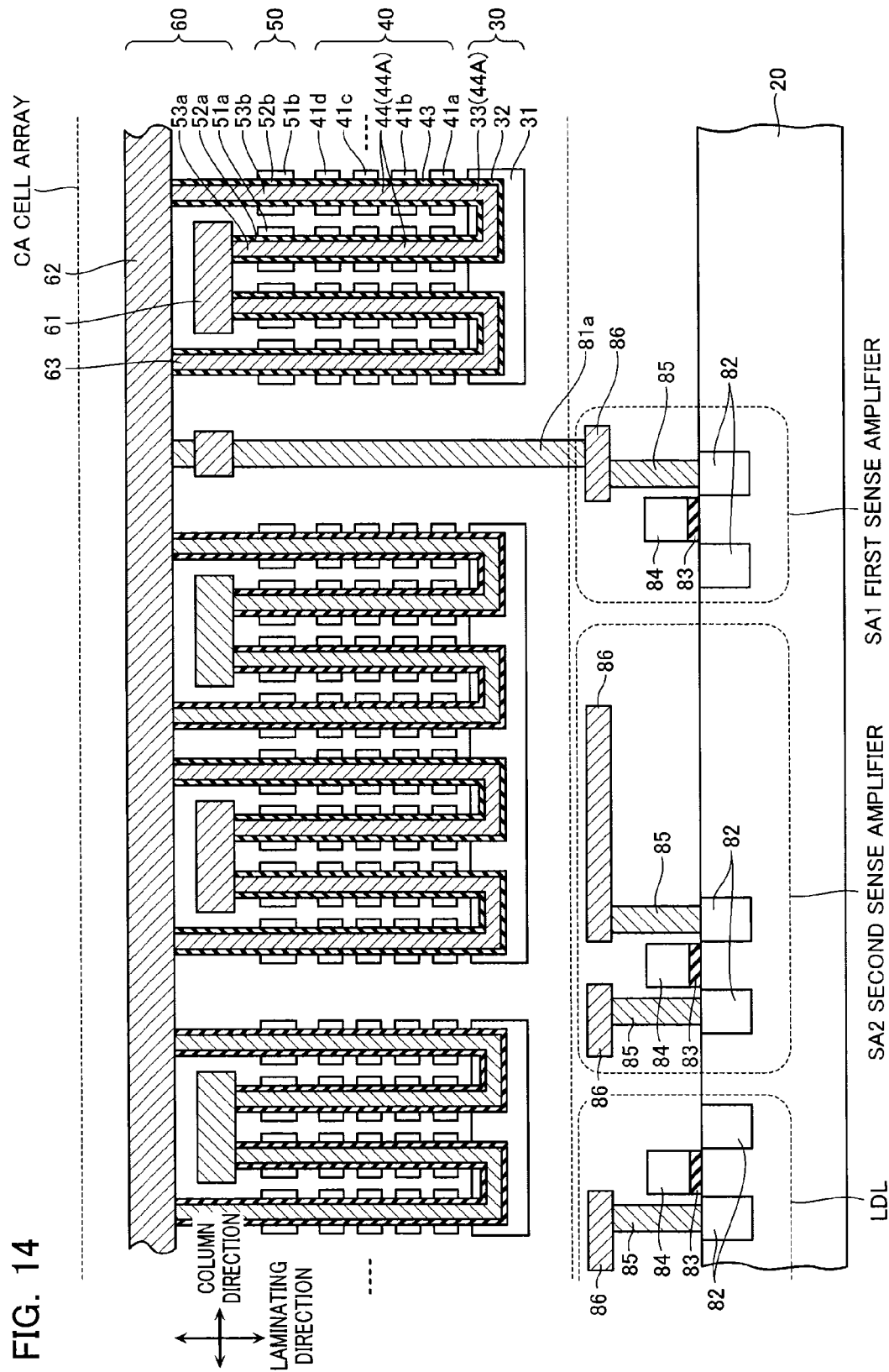
FIG. 14 is a cross sectional diagram of a semiconductor memory device according to a fifth embodiment.

Next, a semiconductor memory device according to a fifth embodiment will be described with reference to FIG. 14. FIG. 14 illustrates across sectional diagram of the semiconductor memory device according to the fifth embodiment. As illustrated in FIG. 14, the fifth embodiment includes a cell array CA having the same three-dimensional structure as the first embodiment. On the other hand, the first sense amplifier SA1, the second sense amplifier SA2, and the latch circuit LDL are provided on the semiconductor substrate 20 directly under the cell array CA. In this respect, the fifth embodiment differs from the first embodiment. In the latch circuit LDL of the fifth embodiment, the transistor Dr of the memory cell DC has a channel on the semiconductor substrate 20. The capacitor C of the memory cell DC is constituted by a gage capacitance of a transistor. Also, the capacitor C may have a typical trench structure, or a stacked structure.

According to the above structure, the fifth embodiment can reduce an occupying area than an example in which the cell array CA, the first sense amplifier SA1, the second sense amplifier SA2, and the latch circuit LDL are arranged in a direction parallel to the semiconductor substrate 20. Further, the fifth embodiment can arrange the latch circuit LDL (volatile memory) near the cell array CA (non-volatile memory).

[Others]

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

A memory cell array formation is disclosed in U.S. patent application Ser. No. 12/532,030. U.S. patent application Ser. No. 12/532,030, the entire contents of which are incorporated by reference herein.

What is claimed is:

1. A semiconductor memory device comprising a non-volatile memory area, a volatile memory area, and a controller, the non-volatile memory area comprising:
   a plurality of first memory cells electrically connected in series, the plurality of first memory cells stacked above a substrate;
   a first select transistor connected to one end of the plurality of first memory cells, the first select transistor being connected to a first bit line; and
   a second select transistor connected to the other end of the plurality of first memory cells, the second select transistor being connected to a first source line, the volatile memory area comprising:
   a plurality of second memory cells electrically connected in series, the plurality of second memory cells stacked above the substrate;
   a third select transistor connected to one end of the plurality of second memory cells, the third select transistor being connected to a second bit line; and
   a fourth select transistor connected to the other end of the plurality of second memory cells, the fourth select transistor being unconnected to a second source line, the controller being configured to supply a first voltage to all gates of the second memory cells, the first voltage being capable of turning on the plurality of second memory cells.

2. The semiconductor memory device according to claim 1, further comprising a sense amplifier formed above the substrate, wherein
   the sense amplifier are connected to the second bit line.

3. The semiconductor memory device according to claim 1, wherein
   the volatile memory area is adjacent to the non-volatile memory area in a direction along which the first bit lines extend, and
   two second bit lines correspond to one first bit line.

4. The semiconductor memory device according to claim 1, wherein
   the controller is configured to apply a second voltage to the fourth select transistor, the second voltage being capable of turning off the fourth select transistor.

5. The semiconductor memory device according to claim 1, wherein
   the fourth select transistor and the second source line being physically separated.

6. The semiconductor memory device according to claim 1, wherein
   the non-volatile memory area comprises a plurality of first word lines each connected each gates of the first memory cells,
   the volatile memory area comprises a plurality of second word lines each connected each gates of the second memory cells,
   the plurality of first word lines are aligned along the vertical direction relative to the substrate, and
   the plurality of second word lines are provided at same positions in the vertical direction as the first word lines.

7. The semiconductor memory device according to claim 1, wherein
   in a read operation, the controller rises a voltage of a gate of the third transistor, then reads a potential difference between a pair of second bit lines.

8. The semiconductor memory device according to claim 1, wherein
   in a write operation, the controller rises a voltage of a gate of the third transistor, then applies voltages to a pair of second bit lines according to data.

9. The semiconductor memory device according to claim 1, wherein the non-volatile memory area comprises a plurality of first word lines each connected each gates of the first memory cells, the volatile memory area comprises a second word line connected gates of the second memory cells, the plurality of first word lines are aligned along the vertical direction relative to the substrate, and the second word line is formed continuously from a position of a lower end of a first word line in the lowest position to a position of an upper end of a first word line in the highest position.

10. The semiconductor memory device according to claim 4, further comprising a fifth select transistor provided between the fourth select transistor and the second source line, wherein the fourth select transistor and the second source line become unconnected by causing the fifth select transistor to be in the off state.

11. The semiconductor memory device according to claim 1, further comprising:

a first sense amplifier electrically connected to the non-volatile memory area; and a second sense amplifier electrically connected to the volatile memory area, wherein the first sense amplifier and the second sense amplifier are arranged above the substrate directly under the volatile memory.

12. The semiconductor memory device according to claim 1, wherein the first memory cells comprise:

a first semiconductor layer comprising a first columnar shaped portion extending in a vertical direction relative to the substrate and configured to function as bodies of the first memory cells;

a first charge accumulating layer surrounding a side surface of the first columnar shaped portion and configured capable of accumulating charges; and a plurality of first conductive layers surrounding the side surface of the first columnar shaped portion via the first charge accumulating layer, and configured to function as gates of the first memory cells, the second memory cells comprise:

a second semiconductor layer comprising a second columnar shaped portion extending in the vertical direction relative to the substrate, and configured to function as bodies of the second memory cells;

a second charge accumulating layer surrounding a side surface of the second columnar shaped portion and configured capable of accumulating charges; and a plurality of second conductive layers surrounding the side surface of the second columnar shaped portion via the second charge accumulating layer, and configured to function as gates of the second memory cells.

13. The semiconductor memory device according to claim 12, wherein the first select transistor comprises:

a third semiconductor layer extending in the vertical direction relative to the substrate, and configured to function as a body of the first select transistor;

a first gate insulating layer surrounding a side surface of the third semiconductor layer; and a third conductive layer surrounding the side surface of the third semiconductor layer via the first gate insulating layer, and configured to function as a gate of the first select transistor, the second select transistor comprises:

a fourth semiconductor layer extending in the vertical direction relative to the substrate, and configured to function as a body of the second select transistor;

a second gate insulating layer surrounding a side surface of the fourth semiconductor layer; and a fourth conductive layer surrounding the side surface of the fourth semiconductor layer via the second gate insulating layer, and configured to function as a gate of the second select transistor, the third select transistor comprises:

a fifth semiconductor layer extending in the vertical direction relative to the substrate, and configured to function as a body of the third select transistor;

a third gate insulating layer surrounding a side surface of the fifth semiconductor layer; and a fifth conductive layer surrounding the side surface of the fifth semiconductor layer via the third gate insulating layer, and configured to function as a gate of the third select transistor, the fourth select transistor comprises:

a sixth semiconductor layer extending in the vertical direction relative to the substrate, and configured to function as a body of the fourth select transistor;

a fourth gate insulating layer surrounding a side surface of the sixth semiconductor layer; and a sixth conductive layer surrounding the side surface of the sixth semiconductor layer via the fourth gate insulating layer, and configured to function as a gate of the fourth select transistor.

14. A semiconductor memory device comprising a volatile memory area, and a controller the volatile memory area comprising:

a plurality of memory cells electrically connected in series, the plurality of memory cells stacked above a substrate;

a first select transistor connected to one end of the plurality of memory cells, the first select transistor being connected to a bit line; and a second select transistor connected to the other end of the plurality of memory cells, the fourth select transistor being unconnected to a source line, the controller being configured to supply a first voltage to all gates of the memory cells, the first voltage being capable of turning on the plurality of memory cells.

15. The semiconductor memory device according to claim 14, further comprising a sense amplifier formed above the substrate, wherein the sense amplifier are connected to the bit line.

16. A semiconductor memory device comprising a non-volatile memory area and a volatile memory area, the non-volatile memory area comprising:

a plurality of memory cells electrically connected in series, the plurality of memory cells stacked above a substrate;

a first select transistor connected to one end of the plurality of memory cells, the first select transistor being connected to a bit line; and a second select transistor connected to the other end of the plurality of memory cells, the second select transistor being connected to a source line, the volatile memory area being provided above the substrate directly under the non-volatile memory area.

17. The semiconductor memory device according to claim 16, further comprising a sense amplifier configured to read from the volatile memory area, wherein the sense amplifier is provided above the substrate directly under the non-volatile memory area.

18. The semiconductor memory device according to claim 16, further comprising a sense amplifier configured to read from the non-volatile memory area, wherein
the sense amplifier is provided above the substrate directly under the non-volatile memory area.

19. The semiconductor memory device according to claim 16, wherein
the volatile memory area comprises capacitor configured to accumulate charges according to data.

20. The semiconductor memory device according to claim 19, wherein
the capacitor is constituted by a gage capacitance of a transistor.

* * * * *